(12) United States Patent
Chen et al.

(10) Patent No.: US 7,709,401 B2
(45) Date of Patent: May 4, 2010

(54) METHOD OF MAKING THERMALLY PROGRAMMABLE ANTI-REVERSE ENGINEERING INTERCONNECTS WHEREIN INTERCONNECTS ONLY CONDUCT WHEN HEATED ABOVE ROOM TEMPERATURE

(75) Inventors: Fen Chen, Williston, VT (US); Cathryn Jeanne Christiansen, Huntington, VT (US); Michael Anthony Shinosky, Jericho, VT (US); Timothy Dooling Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 12/035,448

(22) Filed: Feb. 22, 2008

(65) Prior Publication Data

US 2009/0212431 A1    Aug. 27, 2009

(51) Int. Cl.
*H01L 21/477* (2006.01)
*H01L 21/4763* (2006.01)
*H01L 21/469* (2006.01)
*H01L 21/768* (2006.01)
*H01L 23/485* (2006.01)
*H01L 23/532* (2006.01)

(52) U.S. Cl. .............. 438/783; 438/618; 438/660; 438/917; 257/750; 257/E21.575; 257/E21.591; 257/E21.592; 257/E23.01; 257/E23.019; 257/23.025

(58) Field of Classification Search .......... 257/E21.575, 257/E23.01; 438/618, 660–664, 783
See application file for complete search history.

(56) References Cited

U.S. PATENT DOCUMENTS

| | | | |
|---|---|---|---|
| 4,843,034 A * | 6/1989 | Herndon et al. ............. 438/622 |
| 5,866,933 A | 2/1999 | Baukus et al. |
| 6,320,200 B1 | 11/2001 | Reed et al. |
| 6,432,844 B1 * | 8/2002 | Farrar ........................ 438/783 |
| 6,528,885 B2 | 3/2003 | Vajana et al. |
| 6,897,535 B2 | 5/2005 | Chow et al. |
| 6,924,552 B2 | 8/2005 | Baukus et al. |
| 6,998,688 B2 | 2/2006 | De Jongh et al. |
| 7,085,155 B2 | 8/2006 | Ovshinsky et al. |
| 2002/0173131 A1 | 11/2002 | Clark, Jr. et al. |
| 2004/0212017 A1 | 10/2004 | Mizuno et al. |

* cited by examiner

*Primary Examiner*—Marcos D Pizarro
*Assistant Examiner*—Raj Gupta
(74) *Attorney, Agent, or Firm*—Schmeiser, Olsen & Watts; Richard M. Kotulak

(57) ABSTRACT

An interconnect and method of making the interconnect. The method includes forming a dielectric layer on a substrate, the dielectric layer having a top surface and a bottom surface; forming a first wire and a second wire in the dielectric layer, the first wire separated from the second wire by a region of the dielectric layer; and forming metallic nanoparticles in or on the top surface of the dielectric layer between the first and second wires, the metallic nanoparticles capable of electrically connecting the first wire and the second wire only while the nanoparticles are heated to a temperature greater than room temperature and a voltage is applied between the first and second wires.

12 Claims, 9 Drawing Sheets

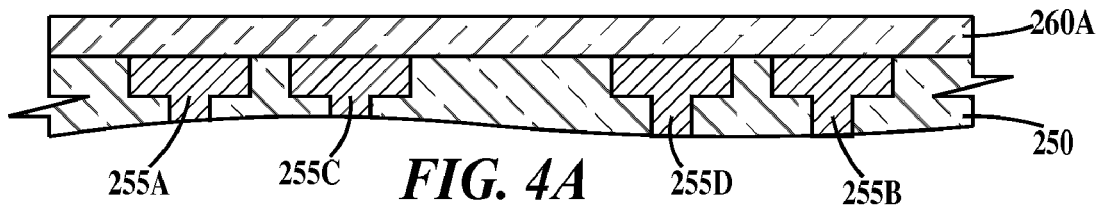
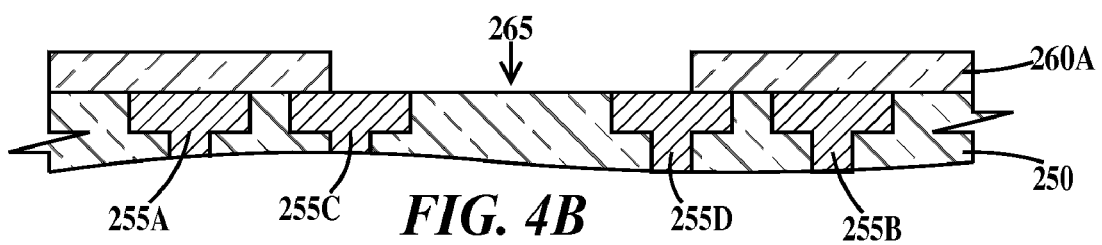
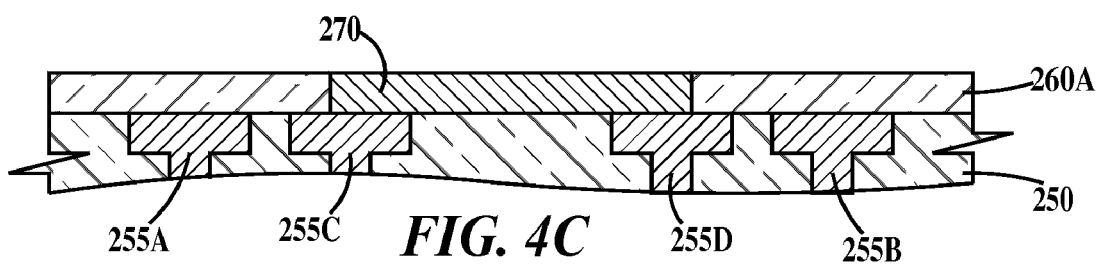
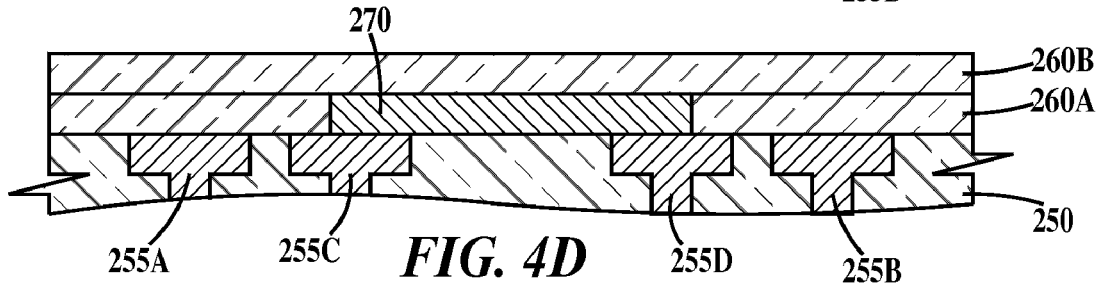
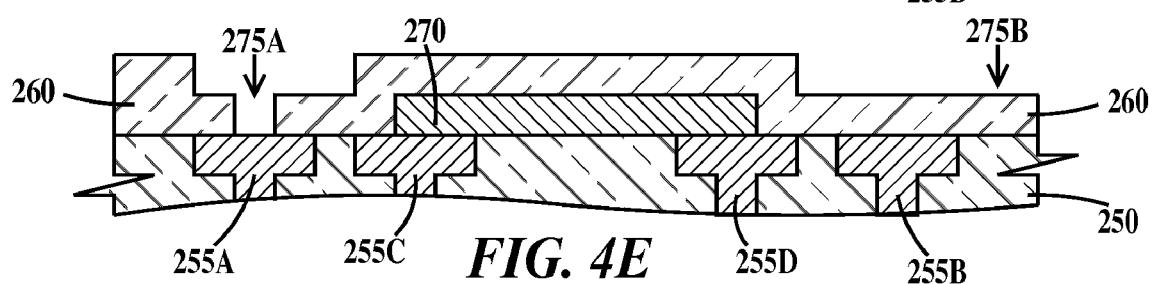
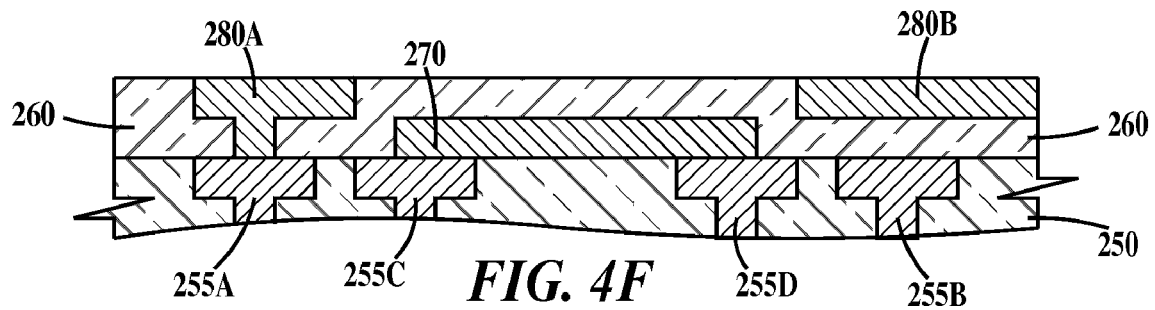

METHOD OF MAKING THERMALLY PROGRAMMABLE ANTI-REVERSE ENGINEERING INTERCONNECTS WHEREIN INTERCONNECTS ONLY CONDUCT WHEN HEATED ABOVE ROOM TEMPERATURE

FIELD OF THE INVENTION

The present invention relates to the field of integrated circuit chips; more specifically, it relates to the prevention of reverse engineering of integrated circuit chips and more particularly to stealth interconnect structures and methods of making stealth interconnect structures during fabrication of integrated circuit chips.

BACKGROUND OF THE INVENTION

Because of economy globalization, fabrication of advanced integrated circuits is migrating to foundries outside of the United States. This trend raises concerns regarding the security of weapons systems, and the protection of intellectual property (IP) and military secrets. High performance microchips within weapons systems have potential vulnerability to maliciously manipulation during chip fabrication. Additionally IP and military secrets are often embedded in the design of microcircuits and the details of the design are often needed by the manufacturer in the fabrication process. Furthermore, there are also issues associated with protecting IP and military secrets after the systems/chips are deployed and sold, especially in circumstances where military systems and chips are lost, captured or are no longer under United States control, and subject to reverse engineering over a sustained period of time. Currently, no effective solution is available to address the above-mentioned issues. Therefore, there is a need for techniques to render integrated circuits difficult to reverse engineer.

SUMMARY OF THE INVENTION

A first aspect of the present invention is a method, comprising: (a) forming a dielectric layer on a substrate, the dielectric layer having a top surface and a bottom surface; (b) forming a first wire and a second wire in the dielectric layer, the first wire separated from the second wire by a region of the dielectric layer; and (c) forming metallic nanoparticles in or on the top surface of the dielectric layer between the first and second wires, the metallic nanoparticles capable of conducting a current between the first and second wires only while the metallic nanoparticles are heated to a temperature greater than room temperature and a differential voltage is applied between the first and second wires.

A second aspect of the present invention is a structure, comprising: a dielectric layer on a substrate, the dielectric layer having a top surface and a bottom surface; a first wire and a second wire in the dielectric layer, the first wire separated from the second wire by a region of the dielectric layer; and metallic nanoparticles in or on the top surface of the dielectric layer between the first and second wires, the metallic nanoparticles capable of conducting a current between the first and second wires only while the metallic nanoparticles are heated to a temperature greater than room temperature and a differential voltage is applied between the first and second wires.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 4A through 4I are cross-sections illustrating fabrication of a first stealth interconnect structure according to an embodiment of the present invention;

DETAILED DESCRIPTION OF THE INVENTION

Figure 1:
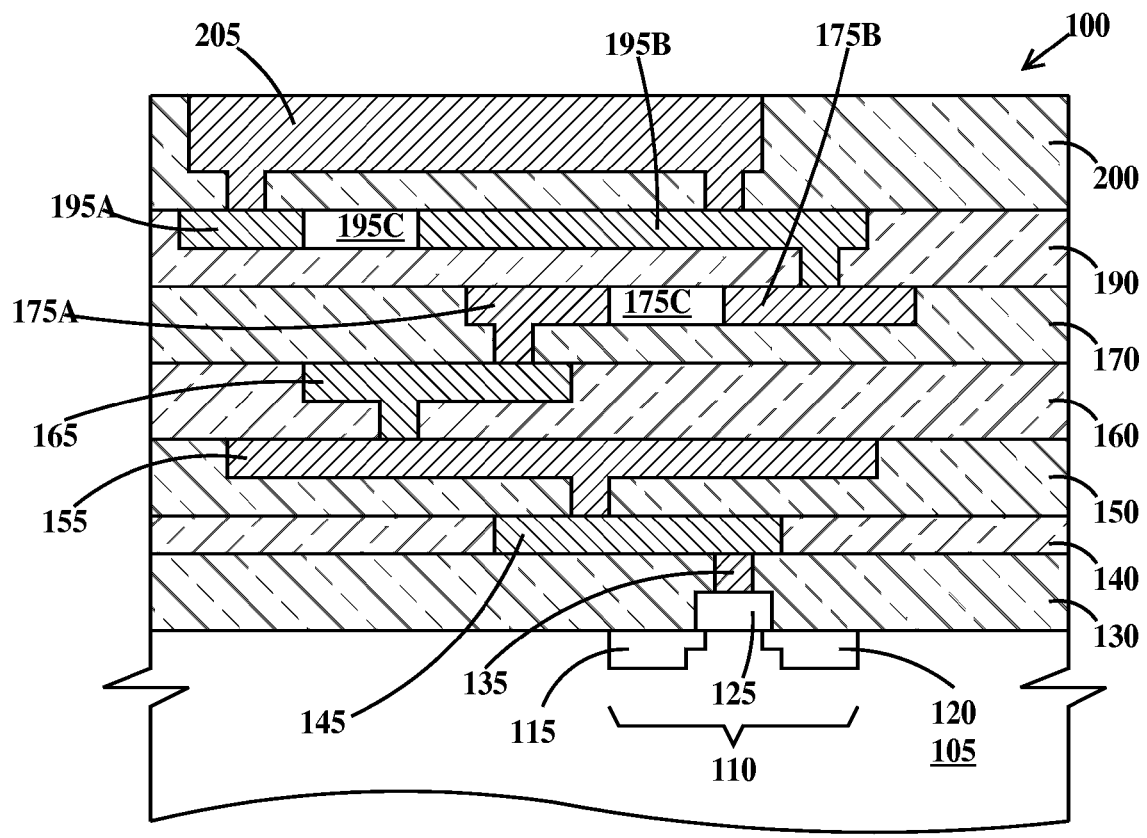
FIG. 1 cross section of an exemplary integrated circuit chip having stealth interconnect structures according to the embodiments of the present invention.

FIG. 1 cross section of an exemplary integrated circuit chip having stealth interconnect structures according to the embodiments of the present invention. In FIG. 1, an integrated circuit chip 100 includes a substrate 105 in which an exemplary field effect transistor 110 has been formed. FET 110 includes a source 115, a drain 120 and a gate 125. Formed on substrate 105 is a dielectric passivation layer 130. Formed passivation layer 130 is a first interlevel dielectric (ILD) layer 140. Formed on first ILD layer 140 is a second ILD layer 150. Formed on second ILD layer 150 is a third ILD layer 160. Formed on third ILD layer 160 is a fourth ILD layer 170. Formed on fourth ILD layer 170 is a fifth ILD layer 190. Formed on fifth ILD layer 190 is a sixth ILD 200. A stud contact 135 in passivation layer 130 electrically connects a wire 145 in first ILD layer 140 to gate 125 of FET 110. A wire 155 in second ILD layer 150 electrically connects a wire 165 in third ILD layer 160 to wire 145. Fourth ILD layer 170 includes a first wire portion 175A and a second wire portion 175B connected by a stealth interconnect 175C. Fifth ILD layer 190 includes a first wire portion 195A and a second wire portion 195B connected by a stealth interconnect 195C. While first wire portion 175A is electrically connected to wire 165 and second wire portion 175B is electrically connected to second wire portion 175B, first and second wire portions 175A and 175B are only electrically connected at elevated temperature as described infra. Likewise while wire portion 195B is electrically connected to wire portion 195B and wire portion 195A is electrically connected to wire sixth ILD layer 205, first and second wire portions 195A and 195B are only electrically connected at elevated temperature.

While only one FET 110 is illustrated in FIG. 1, it should be understood that in advanced integrated circuit chips there may be many millions of FETs and other circuit devices (e.g., diodes, resistors, capacitors, inductors). Likewise, while six ILD layers are represented, there can be almost any number of ILD layers, ten or more being common. The wires in the various ILD layers connect the various devices into circuits (e.g., memory circuits, logic circuits, power networks, etc.). Also in advanced integrated circuit chips, each ILD layer may contain thousands of individual wires and as many stealth interconnects as required to ensure security of the circuit design and operation of the integrated circuit.

Contact 135 and wire 145 are single damascene structures, while wire 155, 165, 175A, 175B, 195A, 195B and 205 are dual-damascene structures and take their names from the process used to fabricate them.

A damascene process is one in which wire trenches or via openings are formed in a dielectric layer, an electrical conductor of sufficient thickness to fill the trenches is deposited on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias.

Figure 2:
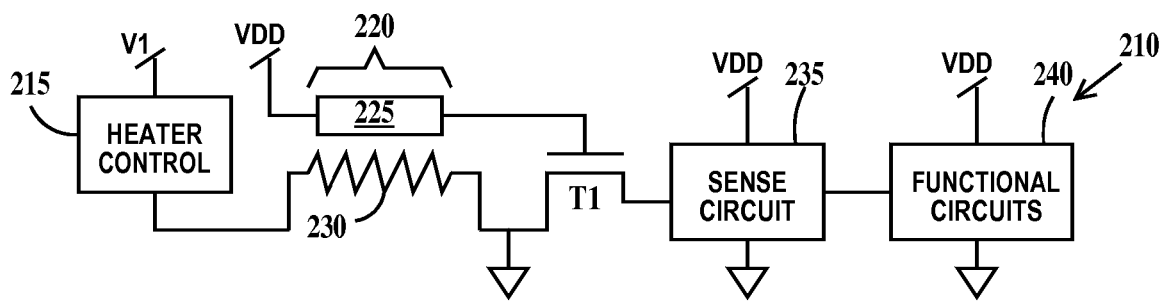
FIG. 2 is a schematic circuit illustrating a first method of incorporating stealth interconnect structures according to the embodiments of the present invention into the circuitry of integrated circuit chips.

FIG. 2 is a schematic circuit illustrating a first method of incorporating stealth interconnect structures according to the embodiments of the present invention into the circuitry of integrated circuit chips. In FIG. 2, a circuit 210 includes a heater control circuit 215, a stealth interconnect 220 comprised of a stealth wire 225 and a heating element 230, a pass gate transistor T1, a sense circuit 235 and functional circuits 240. When current is supplied to heating element 230 by heater control 215, heating element localized heating occurs and stealth wire 225 to a temperature at which it becomes significantly conductive when a voltage differential is applied across the stealth wire and pass gate transistor T1 turns on (for an NFET or off a PFET). Sense circuit 235 senses the state of pass gate 235 and responds by sending signals to functional circuits 240 to activate them. Meanwhile in other circuits stealth wire 225 is absent from stealth interconnect 220 (defining a dummy stealth interconnect) the corresponding pass gate cannot be turned on even when heating element 230 is powered. Since stealth wires 225 are designed to be indistinguishable the surrounding ILD layer using optical or electron microscopy and undetectable by most analytic tools, it is very difficult or impossible to determine the which stealth interconnects are real and which are dummies even if heating element 230 can be detected. Heater controls 215 may themselves be activated (or not) by stealth interconnects.

Figure 3:
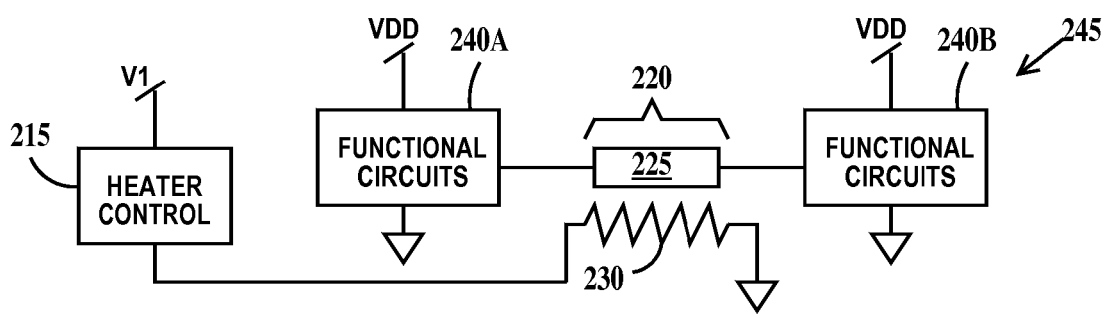
FIG. 3 is a schematic circuit illustrating a first method of incorporating stealth interconnect structures according to the embodiments of the present invention into the circuitry of integrated circuit chips.

FIG. 3 is a schematic circuit illustrating a first method of incorporating stealth interconnect structures according to the embodiments of the present invention into the circuitry of integrated circuit chips. In FIG. 3, a circuit 245 comprises heater control 215 and stealth interconnect 220 with stealth interconnect connecting functional circuits 240A and 240B. When current is supplied to heating element 230 by heater control 215, local heating occurs, heating up stealth wire 225 to a temperature at which it becomes significantly conductive when a voltage differential is applied across the stealth wire and circuits 240A and 240B are electrically connected. Meanwhile in other circuits stealth wire 225 is absent from stealth interconnect 220 (a dummy stealth interconnect) the corresponding functional circuits cannot be turned on even when heating element 230 is powered.

In a third and simplest method of incorporating stealth interconnect structures according to the embodiments of the present invention into the circuitry of integrated circuit chips stealth and dummy stealth interconnects are distributed (randomly or according to a predetermined design) throughout the wiring network comprised of the wires in the various ILD layers. Stealth and dummy stealth interconnects may distributed in one or more of the ILD layers.

Combinations of any two or all three of the methods for incorporating stealth wires and dummy stealth wires described supra may be used in the same integrated circuit chip, including scenarios where dummy heater controls are used. In any of the embodiments of the present invention more than one heater control circuit and/or more than one dummy heater control circuit may be used.

Figure 4G:
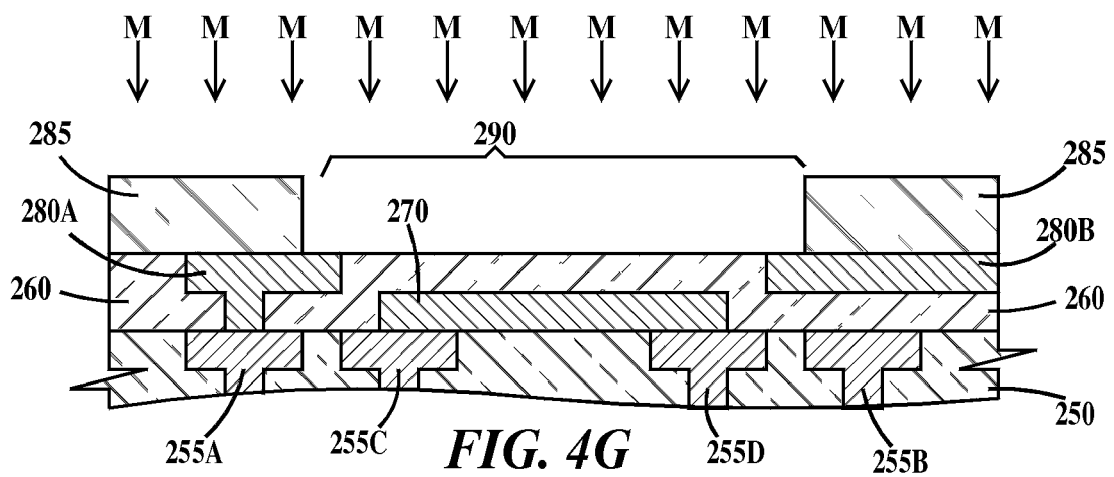

FIGS. 4A through 4I are cross-sections illustrating fabrication of a first stealth interconnect structure according to an embodiment of the present invention. In FIG. 4A, wires 255A, 255B, 255C and 255D have been formed in an ILD layer 250 and an ILD layer 260A formed on the coplanar top surfaces of wires 255A, 255B, 255C and 255D and ILD layer 250. In FIG. 4B and opening 265 is formed in ILD layer 260A exposing portions of wires 255C and 255D. In FIG. 4C a damascene heating element 270 is formed on opening 265. Damascene heating element 270 is electrically connected to wires 255C and 255D. In FIG. 4D, an ILD layer 260B is formed on heating element 270 and ILD layer 260B. ILD layer 260A and 260B may be comprised of the same or different materials. In FIG. 4E, exemplary ILD layer 260 is comprised of ILD layers 260A and 260B of FIG. 4D of the same material so as not to complicate the drawings, the interface between layers 260A and 260B is not shown. In FIG. 4E, trenches 275A and 275B have been etched into ILD layer 260. In FIG. 4F, a dual-damascene wire 280A and a damascene wire 280B have been formed in respective trenches 275A and 275B. Top surfaces of wires 280A, 280B and ILD layer 260 are coplanar.

Figure 4H:
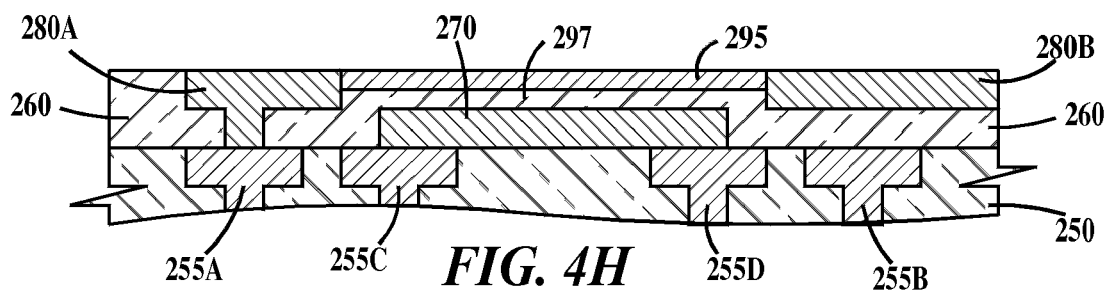
Figure 4I:
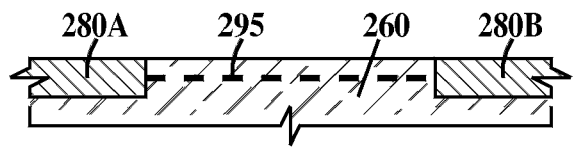

In FIG. 4G, photoresist layer 285 is formed on top of ILD layer 260 and wires 280A and 280B. Photoresist is an exemplary material for a masking layer. An opening 290 is formed in photoresist layer 285 over heating element 270 exposing portions of wires 280A and 280B in the opening. Then a metal ion implantation (M) is performed to form a layer of metal atoms in dielectric layer 260 followed by a low temperature activation anneal (e.g., between about 100° C. to about 250° C.) resulting in (by agglomeration of metal atoms of the layer of metal atoms into metallic nanoparticles) a stealth wire 295 comprised of a region of dielectric layer 260 containing metallic nanoparticles as illustrated in FIG. 4H. The activation anneal may be performed later in the fabrication process. Stealth wire 295 does not touch heating element 270. The thickness of stealth layer 295 is grossly exaggerated in FIGS. 4H (and 4I) the actual thickness being so thin as to not be visible in the scale of the drawings. The stealth connection comprises stealth wire 295, heating element 270 and a region 297 of dielectric layer 260 between stealth wire 295 and heating element 270. The amount of metal in the metallic nanoparticles and size of the metallic nanoparticles in stealth wire 295 are both too small to be visible by optical or electron microscopy or detected by most analytic tools. In FIG. 4H, stealth wire 295 is illustrated as extending from a top surface of dielectric layer 260 into the dielectric layer. Alternatively, the ion-implantation voltage may be adjusted to as embed stealth wire 295 completely within dielectric layer 260, there being a layer of dielectric above and below the stealth wire as shown in FIG. 4I.

When heat (by forcing a current through heating element 270 or by other means) and voltage differential is applied across wires 280A and 280B, electron-hopping conduction occurs between the metallic nanoparticles so an electrical connection is made between wire 280A and wire 280B and current can flow. The conductivity of stealth wire 295 is governed by the equation:

$$\sigma = \sigma_{Oo} \exp\left[\left(\frac{T}{T_o}\right)^{-1/4}\right]$$

where $\sigma$ is electrical conductivity, $\sigma_o$ is electrical conductivity at absolute zero, T is temperature in degrees Kelvin and $T_o$ is a characteristic temperature in degrees Kelvin which represents the energy needed for an electron to hop from one nanoparticle to another.

Figure 11:
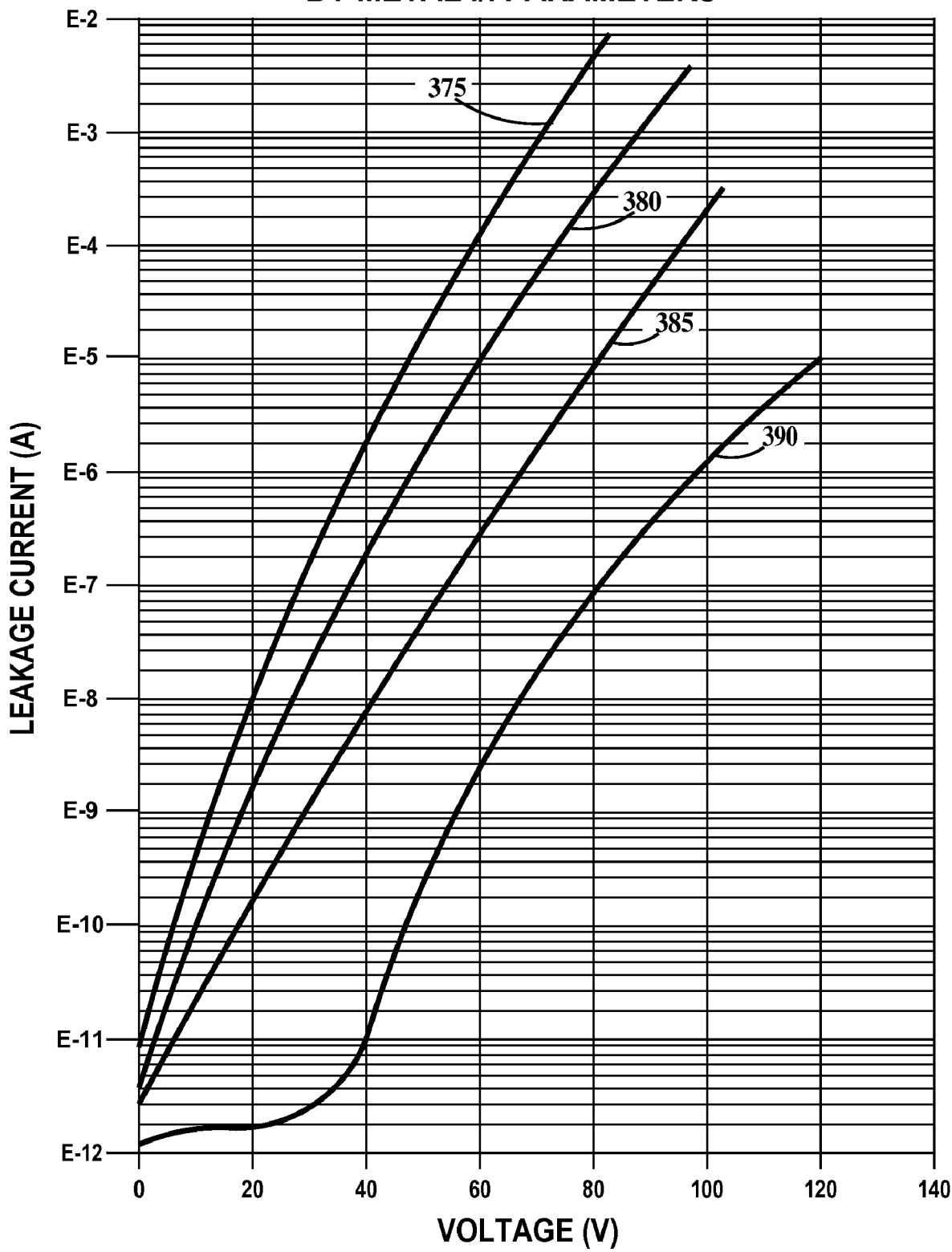
FIG. 11 is a plot of leakage current versus voltage as a function of the ion-implantation parameters.

Turning to FIG. 11, FIG. 11 is a plot of leakage current versus voltage as a function of ion-implantation parameters. In FIG. 11 curve 375 represents a 2E15 atm/cm$^2$ dose of tantalum (Ta) at 30 KeV implanted into a dielectric film, curve 380 represents a 2E15 atm/cm$^2$ dose of Ta at 50 KeV implanted into the dielectric film, curve 385 represents a 2E14 atm/cm2 dose of Ta at 50 KeV implanted into the dielectric film and curve 390 is the un-implanted dielectric film. Curves 375, 380, 395 and 390 were obtained at room temperature (i.e. between about 18° C. and about 24° C.). These curves indicate a significant difference in conduction between the un-implanted dielectric film and the Ta implanted dielectric film.

Figure 5:
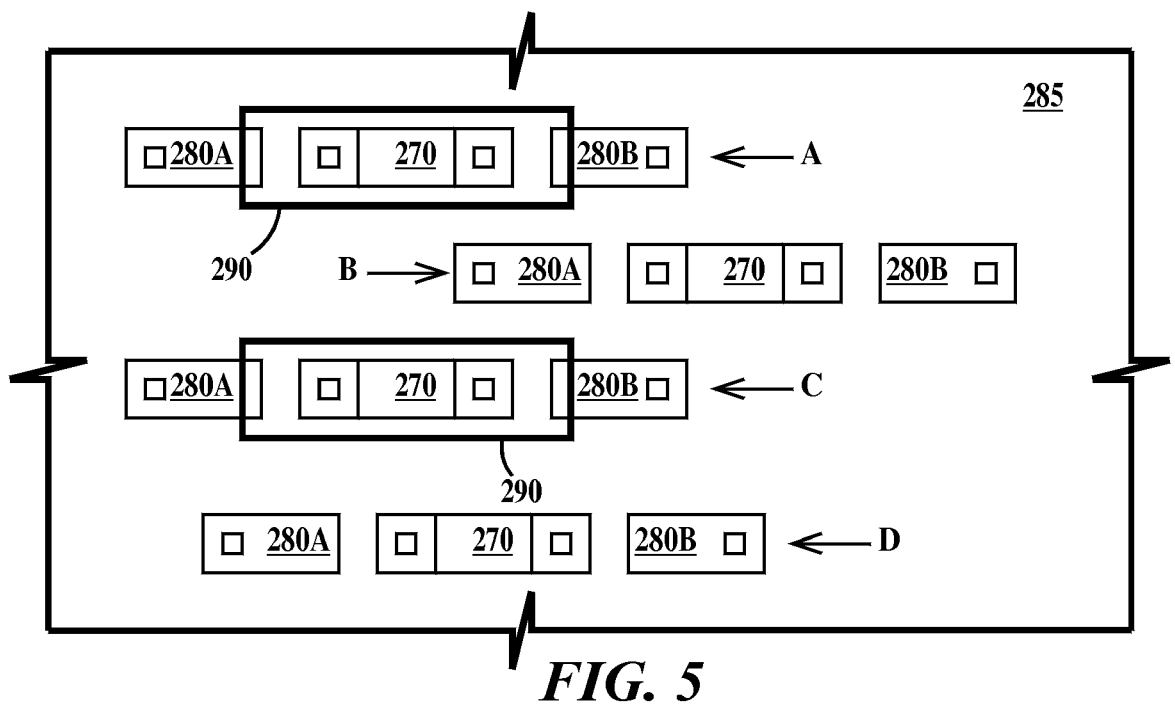
FIG. 5 is a top view of a photolithographic fabrication step common to the first, second and third stealth interconnect structures of the present invention.
Figure 12:
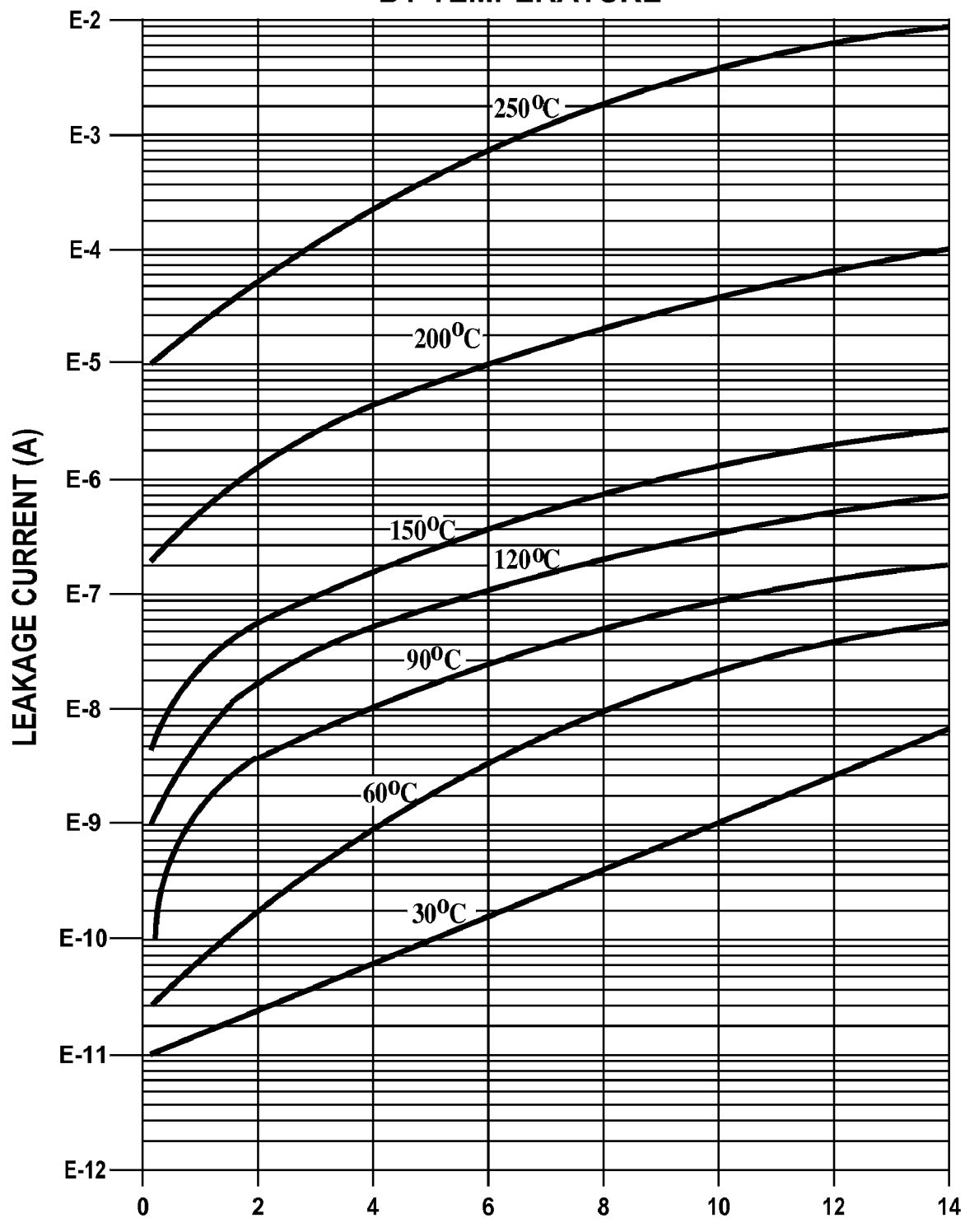
FIG. 12 is a plot of leakage current versus voltage as a function of temperature in a metal implanted dielectric film.

Turning to FIG. 12, FIG. FIG. 12 is a plot of leakage current versus voltage as a function of temperature in a metal implanted dielectric film. In FIG. 5, curves are given for Tungsten (W) implanted into phosphosilicate glass (PSG) at 30° C., 60° C., 90° C., 120° C., 150° C., 200° C., and 250° C. Taking 3.6 volts as an example, it can be seen from FIG. 12, that at about 150° C. about 100 nA of current flows but at 30° C. only 0.005 nA of current flows. Thus, the implanted layer is essentially un-conductive until heated above about 100° C. (at 3.6 volts).

In all embodiments of the present invention, the stealth wires only carry a significant current (are significantly conductive) at the operating voltage of the integrated circuit chip (or circuit containing the stealth wire when the integrated circuit chips has two or more voltage domains) while heated to or above a conduction temperature with voltage differential (e.g., VDD to GND) applied across the stealth wire and do not carry significant current below the conduction temperature. In one example the conduction temperature is a temperature greater than room temperature (room temperatures is a temperature between about 18° C. and about 24° C.). In one example the conduction temperature is 30° C. In one example the conduction temperature is 100° C. In one example significant current is defined as 1 nA or greater. In one example, significant current is defined as 10 nA or greater. Because even insulators conduct finite amounts of current, an example of an insignificant current is a current so low as to not effect any device or circuit connected to the stealth wire when the stealth wire is at a temperature below the conduction temperature, the device or circuit "ignores" the minute current flow.

Returning to FIG. 4H, in one example wires 255A, 255B, 255C, 255D, 280A and 280B comprise a core of copper (Cu) and a liner comprised of layers of Ta and Ta nitride (TaN) or a liner comprised of titanium (Ti) and Ti nitrided (TiN). In one example wires 255A, 255B, 255C, 255D, 280A and 280B comprise W. In one example heating element 270 comprises TaN, TiN or polysilicon. In one example dielectric layer 250 and dielectric layers 260A, 260B, and 260 (see FIGS. 4D and 4E) independently comprise a material selected from the group consisting of silicon dioxide ($SiO_2$), silicon nitride ($Si_3N_4$), silicon carbide (SiC), silicon oxy nitride (SiON), silicon oxy carbide (SiOC), organosilicate glass (SiCOH), plasma-enhanced silicon nitride ($PSiN_x$), NBLok (SiC(N, H)), hydrogen silsesquioxane polymer (HSQ), methyl silsesquioxane polymer (MSQ), SiLK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) manufactured by Applied Materials, Santa Clara, Calif., organosilicate glass (SiCOH), porous SiCOH and a low K (dielectric constant) material. A low K dielectric material has a relative permittivity of about 2.4 or less. In one example, stealth wire 295 comprises Cu, Ta, Ti or W.

FIG. 5 is a top view of a photolithographic fabrication step common to the first, second and third stealth interconnect structures of the present invention. While the stealth wires are essentially not detectable, heaters 270 are, therefore some stealth interconnects will be dummy stealth interconnects. A dummy stealth interconnect includes a heater but not a stealth wire. This is easily accomplished by performing the ion implant step illustrated in FIG. 4G (or the steps illustrated in FIGS. 6B, 7C and described infra) where stealth interconnects are desired but not where dummy stealth interconnects are desired. In FIG. 5, where openings 290 in photoresist layer 285 have been formed over heaters 270, stealth interconnects A and C will be formed, but where openings 290 have been not formed over heaters 270 and regions of wires 280A and 280B, dummy stealth interconnects D and D will result because photoresist layer blocks any implanted (or deposited) metal atoms from reaching dielectric layer 260 (see FIG. 4G). The length of a stealth wire is defined by the length of opening 290 measured in a lengthwise direction from wire 280A to wire 280B and the width of a stealth wire is defined by the width of opening 290 is a widthwise direction perpendicular to the first direction. Heating element 270 has a length measured in the lengthwise direction and a width measured in the widthwise direction. In FIG. 5, the width of a stealth wire will be greater than a width of a heating element. However, by reducing the width of opening 290, the width of the stealth wire can be made less than the width of the heater.

The photomask used to define where openings 290 are formed is advantageously generated in a trusted or secure facility.

The actual fabrication of openings 290 is advantageously performed in a trusted or secure facility or a secured location with the fabrication facility and the photomasks must be kept secure. When direct write lithography is used (e.g., e-beam lithography) the data storage media the lithography tool uses is advantageously secured (e.g., by encryption) and/or the lithography tool is housed in a trusted or secure fabricating facility or portion of the fabricating facility.

Figure 6A:
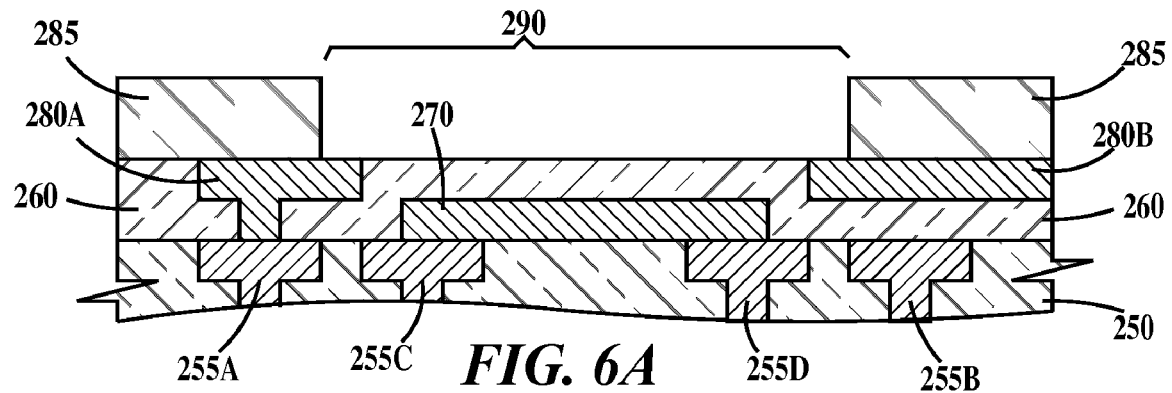
FIGS. 6A through 6C are cross-sections illustrating fabrication of a second stealth interconnect structure according to an embodiment of the present invention.
Figure 6B:
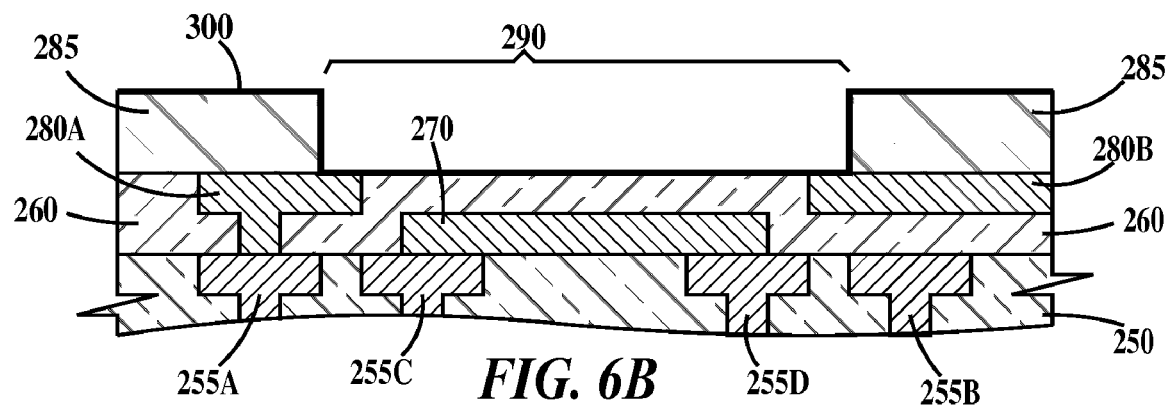
Figure 6C:
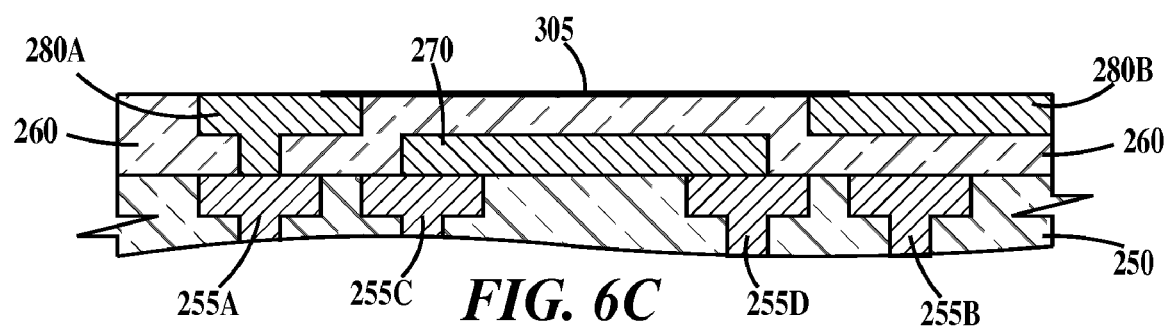

FIGS. 6A through 6C are cross-sections illustrating fabrication of a second stealth interconnect structure according to an embodiment of the present invention. Prior to performing the process steps illustrated in FIG. 6A, the process steps illustrated in FIGS. 4A through 4F and described supra are performed. In FIG. 6A, photoresist layer 285 is formed on top of ILD layer 260 and wires 280A and 280B. Opening 290 is formed in photoresist layer 285 over heating element 270 exposing portions of wires 280A and 280B in the opening. In FIG. 6B, a thin (about one to about two monolayers) metal layer 300 is formed over photoresist layer 285 and all regions of the top surfaces of dielectric layer 260 and wires 280A and 280B not covered by photoresist layer 285. Layer of metal 300 may prepared, for example, by atomic layer deposition (ALD), molecular beam epitaxy (MBE) or self assembled monolayer (SAM) techniques. In FIG. 6C, photoresist layer 285 (see FIG. 6B) is removed and a low temperature activation anneal performed (e.g., between about 100° C. to about 250° C.) resulting in (by agglomeration of metal atoms of metal layer 300 into metallic nanoparticles) a stealth wire 305 comprised of a surface layer of metallic nanoparticles. In one example, stealth wire 305 comprises Cu, Ta, Ti or W.

Figure 7A:
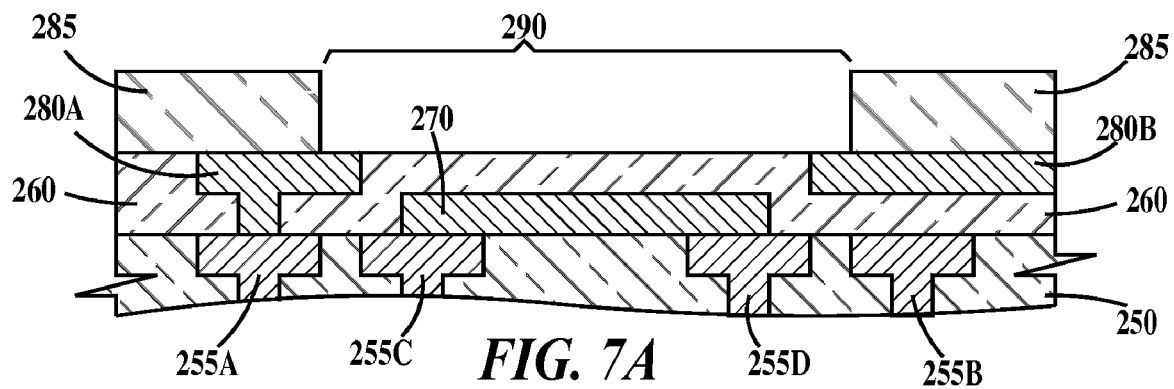
FIGS. 7A through 7D are cross-sections illustrating fabrication of a third stealth interconnect structure according to an embodiment of the present invention.
Figure 7B:
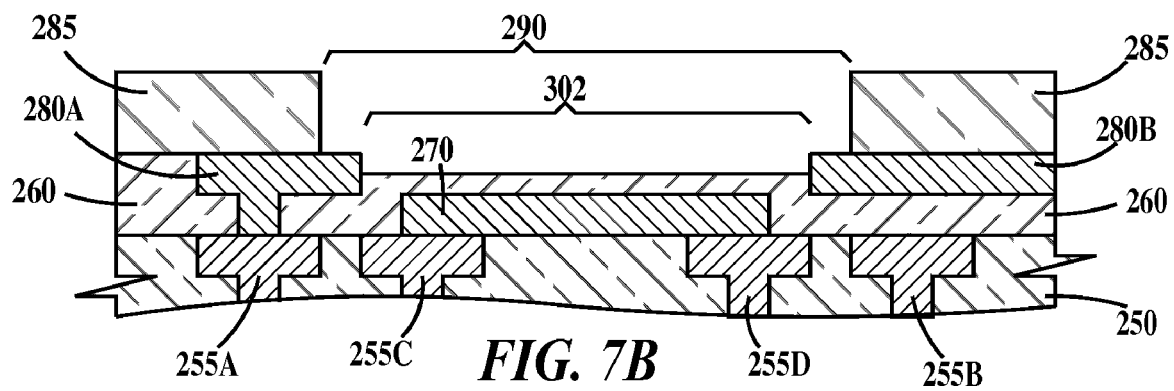
Figure 7C:
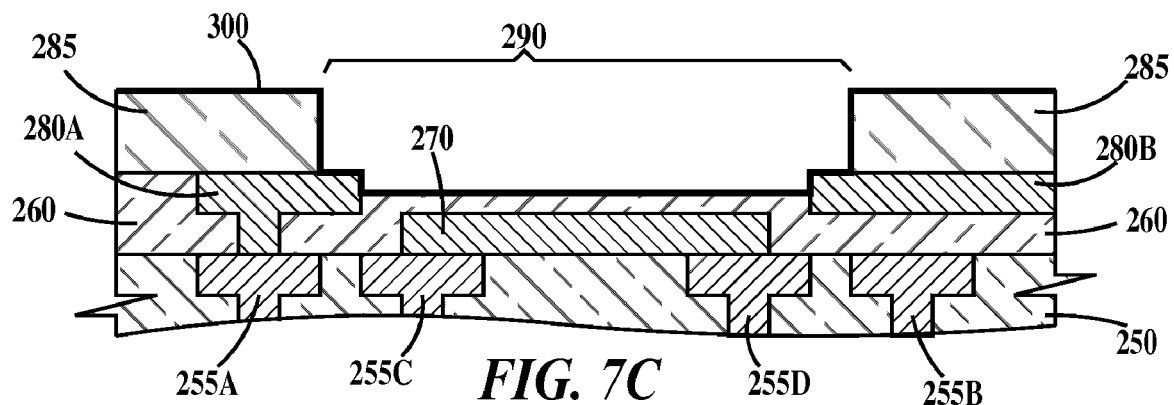
Figure 7D:
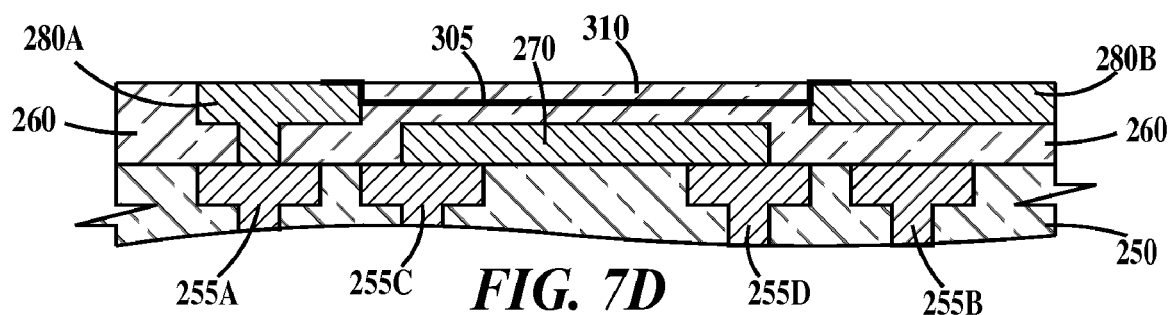

FIGS. 7A through 7D are cross-sections illustrating fabrication of a third stealth interconnect structure according to an embodiment of the present invention. Prior to performing the process steps illustrated in FIG. 7A, the process steps illustrated in FIGS. 4A through 4F and described supra are performed. In FIG. 7A, photoresist layer 285 is formed on top of ILD layer 260 and wires 280A and 280B. Opening 290 is formed in photoresist layer 285 over heating element 270 exposing portions of wires 280A and 280B in the opening. In FIG. 290, regions of ILD layer 260 exposed in opening 290 are etched to form a recess 302 in ILD layer 260. Then in FIG. 7C, metal layer 300 is formed as describe supra. In FIG. 7D, photoresist layer 285 (see FIG. 7C) is removed. A dielectric layer 310 is formed and a CMP performed, after which, top surfaces of ILD layer 260, wires 280A and 280B and remaining dielectric layer 305 are coplanar. A low temperature activation anneal (e.g., between about 100° C. to about 250° C.) is performed either before or after forming dielectric layer 310 resulting in (by agglomeration of metal atoms of metal layer 300 into metallic nanoparticles) stealth wire 305 comprised of metallic nanoparticles. Stealth wire 305 is sandwiched between ILD layer 260 and dielectric layer 310. It is advantageous, though not required that dielectric layer 310 and ILD layer 260 be the same material.

Figure 8A:
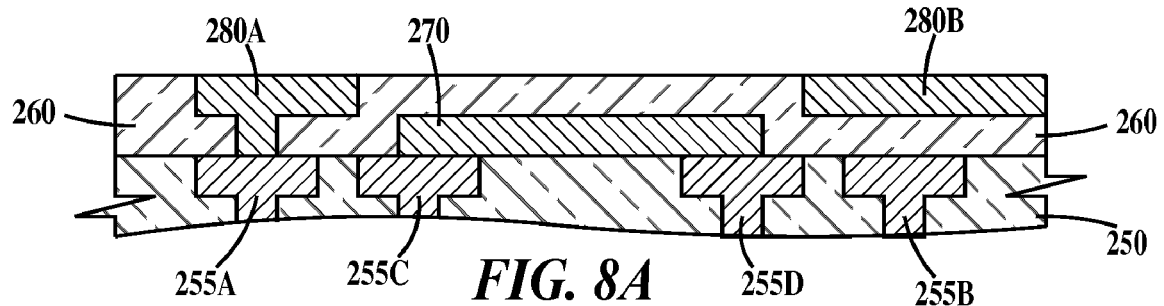
FIG. 8A through 8C are cross-sections illustrating fabrication of a fourth stealth interconnect structure according to an embodiment of the present invention.
Figure 8B:
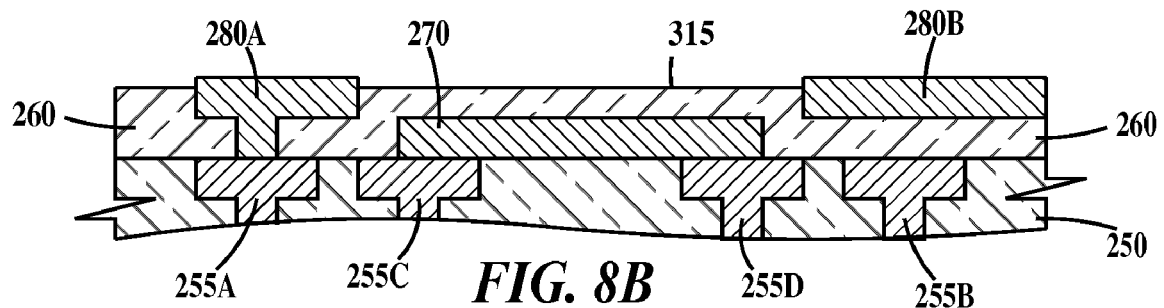
Figure 8C:
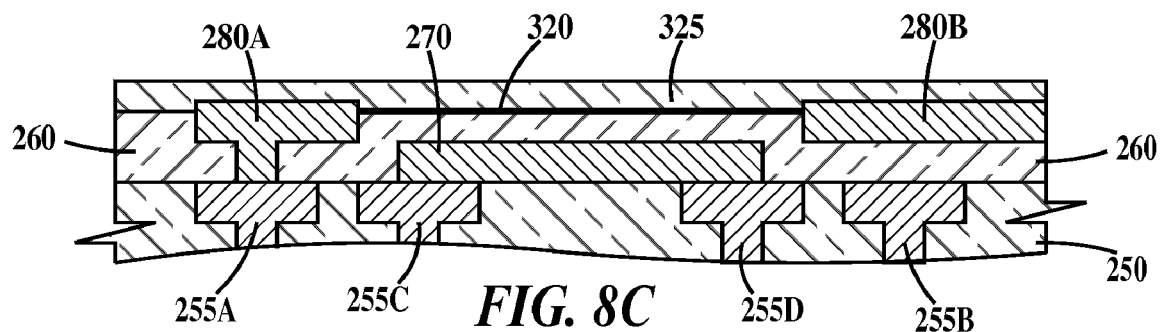

FIG. 8A through 8C are cross-sections illustrating fabrication of a fourth stealth interconnect structure according to an embodiment of the present invention. Prior to performing the process steps illustrated in FIG. 8A, the process steps illustrated in FIGS. 4A through 4F and described supra are performed. In a first alternative, FIG. 8A is identical to FIG. 4F and is the starting point for a second CMP process that will remove ILD layer 260 faster than wires 280A and 280B so after the second CMP process wires 280A and 280B extend above the top surface 315 of ILD layer 260. In a second alternative, the CMP process of FIG. 4F generates the structure illustrated in FIG. 8B directly. In FIG. 8C, a dielectric layer 325 is formed on ILD layer 260 and wires 280A and 280B and optionally a CMP performed. Next a programming voltage is applied across wires 280A and 280B to cause metal migration from wire 280A (or from wire 280B) toward wire 280B (or toward wire 280A) injecting metal atoms into the interface between dielectric layers 260 and 325 resulting in a stealth wire 320 comprised of metallic nanoparticles. The programming voltage may be applied for a predetermined duration of time or under a predetermined current flow is measured between first and second wires 280A and 280B. A low temperature activation anneal (e.g., between about 100° C. to about 250° C.) may or may be required. In one example, stealth wire 320 comprises Cu. It is advantageous, though not required that dielectric layer 320 and ILD layer 260 be the same material.

Figure 9A:
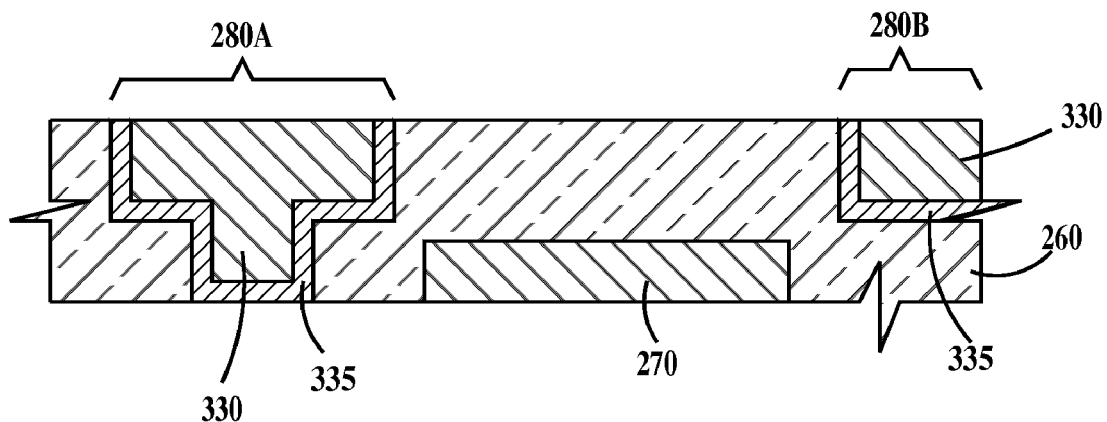
FIGS. 9A through 9C are more detailed cross-sections illustrating fabrication of the fourth stealth interconnect structure.
Figure 9B:
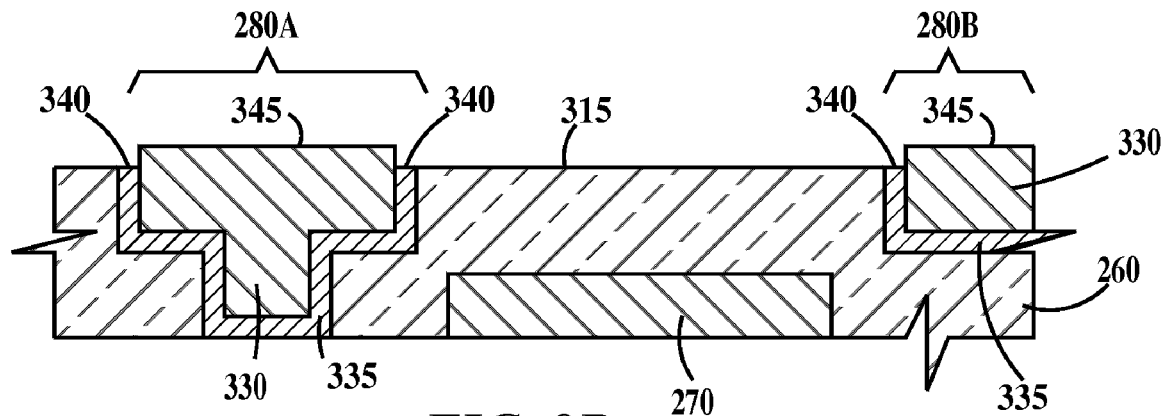
Figure 9C:
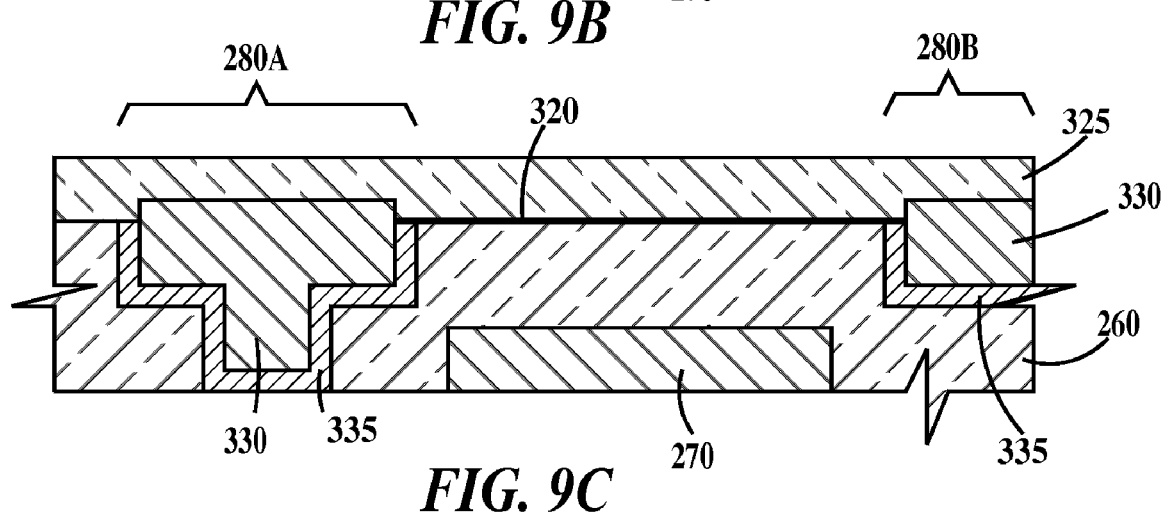

FIGS. 9A through 9C are more detailed cross-sections illustrating fabrication of the fourth stealth interconnect structure. In FIG. 9A, it can be seen that wires 260A and 280B each comprise a core 330 and a liner 335. In one example core 330 comprises Cu and liner 335 comprises a layer of Ta (or Ti) on a layer TaN (or TiN) with the TaN or TaN layer contacting ILD layer 260 on the sides of wires 280A and 280B. In FIG. 9B, after the CMP, top surface 315 and top edges 340 of liners 335 are recessed below top surfaces 345 of cores 330. In FIG. 9C, stealth wire 320 has been formed.

Figure 10:
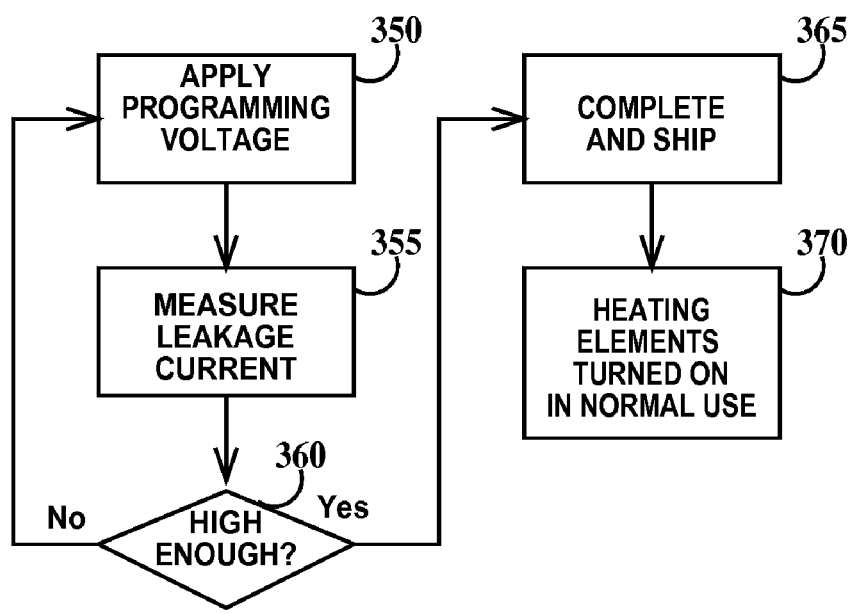
FIG. 10 is a flowchart, illustrating a methodology to be applied to the fourth interconnect structure.

FIG. 10 is a flowchart, illustrating a methodology to be applied to the fourth interconnect structure. In step 350, a programming voltage (e.g., at least two times higher than the operating voltage(s) of the integrated circuit is applied between wires where a stealth wire is to be formed. In optional steps 355 and 360, a leakage current of the stealth wire is be measured and programming repeated or adjusted (e.g., voltage, time increased) until the conduction of the stealth wire is within a predetermined limit, but lower than when heat and normal operating voltages are applied across the stealth wire. This programming is advantageously performed in a trusted or secure facility. Then in step 365, any additional fabrication steps are performed and the integrated circuit shipped to the user. In step 370, the during normal use of the integrated circuit the heating elements are turned on as appropriate to operate the integrated circuit.

In alternative embodiments to the first, second, third and fourth embodiments, no heaters are formed under the stealth wires, but means is supplied to heat regions of the integrated circuit or the entire integrated circuit to the temperature at which the stealth wires become significantly conductive (carries a significant current at the operating voltage of the integrated circuit chip or circuit containing the stealth wire when the integrated circuit chips has two or more voltage domains) to pass enough current to detected by circuits connected to the stealth wire.

Thus the embodiments of the present invention provide techniques to render integrated circuits difficult to reverse engineer, by providing interconnect wiring structures and methods of making interconnect wiring structures that are difficult to reverse engineer.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   (a) forming a dielectric layer on a substrate, said dielectric layer having a top surface and a bottom surface;

(b) forming a first wire and a second wire in said dielectric layer, said first wire separated from said second wire by a region of said dielectric layer; and (c) forming metallic nanoparticles in or on said top surface of said dielectric layer between said first and second wires, said metallic nanoparticles capable of conducting a current between said first and second wires only while said metallic nanoparticles are heated to a temperature greater than room temperature and a differential voltage is applied between said first and second wires.

2. The method of claim 1, (c) including:

ion implanting metal atoms into regions of said dielectric layer between said first and second wires to form a layer of metal atoms in said dielectric layer; and heating said layer of metal atoms to a temperature greater than room temperature to form said metallic nanoparticles.

3. The method of claim 1, (c) including:

forming a masking layer on said dielectric layer and said first and second wires;

forming an opening in said masking layer, said opening overlapping regions of both said first and second wires;

depositing between about one to about two monolayers of metal atoms on regions of said dielectric layer exposed in said opening;

after said depositing, removing said masking layer; and after said removing, heating said layer of metal atoms to a temperature greater than room temperature to form said metallic nanoparticles.

4. The method of claim 1, (c) including:

forming a masking layer on said dielectric layer and said first and second wires;

forming an opening in said masking layer, said opening overlapping regions of both said first and second wires;

recessing a top surface of said dielectric layer in said opening below top surfaces of said first and second wires;

depositing between about one to about two monolayers of metal atoms on regions of said dielectric layer exposed in said opening;

after said depositing, removing said masking layer; and after said removing, heating said about one to about two monolayers of metal atoms to a temperature greater than room temperature to form said metallic nanoparticles.

5. The method of claim 1, (c) including:

(i) recessing a top surface of said dielectric layer below top surfaces of said first and second wires;

(ii) applying a programming voltage between said first and second wires until either a predetermined current greater than zero is measured between said first and second wires or for a predetermined amount of time, said programming voltage causing electromigration of metal atoms from said first wire toward said second wire to form a layer of metal atoms on said top surface of said dielectric layer between said first and second wires;

after (ii), (iii), heating said layer of metal atoms to a temperature greater than room temperature to form said metallic nanoparticles.

6. The method of claim 5, wherein said first and second wires are damascene or dual damascene wires each wire of said first and second wires comprising electrically conductive cores separated from said dielectric layer by electrically conductive liners; and (i) includes recessing a top surface of said liners below top surfaces of said cores.

7. The method of claim 1, further including:

(d) forming a heating element buried in said dielectric layer, said heating element having opposite first and second ends, said first end of said heating element adjacent to said first wire, said second end of said heating element adjacent to said second wire, said metallic nanoparticles over but not in contact with said heating element.

8. The method of claim 1, (b) further including forming a third wire and a fourth wire in said dielectric layer, said third wire separated from said fourth wire by an additional region of said dielectric layer;

(c) not including forming metallic nanoparticles in or on said top surface of said additional region of said dielectric layer between said third and fourth wires; and further including (d) forming a first heating element and a second heating element buried in said dielectric layer, said first and second heating element having respective opposite first and second ends, said first end of said first heating element adjacent to said first wire, said second end of said first heating element adjacent to said second wire, said first end of said second heating element adjacent to said third wire, said second end of said second heating element adjacent to said fourth wire, said metallic nanoparticles over but not in contact with said first heating element, no nanoparticles over said second heating element.

9. The method of claim 1, wherein said substrate is a semiconductor substrate and said first and second wires interconnect circuit devices in said substrate into an integrated circuit.

10. The method of claim 1, further including:

(d) forming a heating element buried in said dielectric layer, said heating element having opposite first and second ends, said first end of said heating element adjacent to said first wire, said second end of said heating element adjacent to said second wire, said metallic nanoparticles over but not in contact with said heating element;

(e) forming a heater control circuit, a pass gate device, a sense circuit, and functional circuits in said substrate and wiring levels formed on said substrate; and (f) connecting said heating element to said heater control circuit, connecting said first wire to said pass gate device, connecting said pass gate device to said sense circuit and connecting said sense circuit to said functional circuits.

11. The method of claim 1, further including:

(d) forming a heating element buried in said dielectric layer, said heating element having opposite first and second ends, said first end of said heating element adjacent to said first wire, said second end of said heating element adjacent to said second wire, said metallic nanoparticles over but not in contact with said heating element;

(e) forming a heater control circuit and first and second circuits in said substrate and wiring levels formed on said substrate; and (f) connecting said heating element to said heater control circuit and connecting said first wire to said first circuit and connecting said second wire to said second circuit.

12. The method of claim 1, wherein said dielectric layer and said first and second wires comprise a wiring level of an integrated circuit.

* * * * *